United States Patent
Wu et al.

(10) Patent No.: US 7,306,969 B2
(45) Date of Patent: Dec. 11, 2007

(54) METHODS TO MINIMIZE CONTACT RESISTANCE

(75) Inventors: Yiliang Wu, Mississauga (CA); Beng S. Ong, Mississauga (CA); Yuning Li, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 320 days.

(21) Appl. No.: 11/187,552

(22) Filed: Jul. 22, 2005

(65) Prior Publication Data

US 2007/0020798 A1    Jan. 25, 2007

(51) Int. Cl.
*H01L 51/40* (2006.01)
(52) U.S. Cl. .................. 438/99; 257/E21.242
(58) Field of Classification Search .......... 438/99; 257/E21.242

See application file for complete search history.

(56) References Cited

U.S. PATENT DOCUMENTS

2003/0160230 A1    8/2003    Ong et al.

*Primary Examiner*—Scott B. Geyer
*Assistant Examiner*—Seahvosh Nikmanesh
(74) *Attorney, Agent, or Firm*—Eugene O. Palazzo; Fay Sharpe LLP

(57) ABSTRACT

A method is disclosed for making a metal electrode which minimizes the contact resistance between it and an organic semiconductor. Acid-stabilized metal nanoparticles are deposited upon a substrate and annealed. This creates a metal electrode and releases acid. Upon deposition of semiconductor and subsequent annealing, the acid diffuses from the electrode into the semiconductor layer and acts as a dopant, minimizing the contact resistance. The use of oleic acid-stabilized silver nanoparticles is demonstrated.

15 Claims, 4 Drawing Sheets

METHODS TO MINIMIZE CONTACT RESISTANCE

The U.S. Government has a paid-up license in this development and the right in limited circumstances to require the patent owner to license others on reasonable terms as provided for by the terms of NIST Contract No. 70NAN-BOH3033.

BACKGROUND

The present disclosure relates to methods for making electrically conductive electrodes for electronic devices, such as organic thin-film transistors ("OTFT"s), with no or minimum contact resistance between the electrodes and the semiconductor. The present disclosure also relates to electronic devices produced by such methods.

Thin film transistors (TFTS) are fundamental components in modern-age electronics, including, for example, sensors, image scanners, and electronic display devices. TFT circuits using current mainstream silicon technology may be too costly for some applications, particularly for large-area electronic devices such as backplane switching circuits for displays (e.g., active matrix liquid crystal monitors or televisions) where high switching speeds are not essential. The high costs of silicon-based TFT circuits are primarily due to the use of capital-intensive silicon manufacturing facilities as well as complex high-temperature, high-vacuum photolithographic fabrication processes under strictly controlled environments. OTFTs offer not only much lower manufacturing costs, but also appealing mechanical properties such as being physically compact, lightweight, and flexible.

OTFTs are generally composed of a supporting substrate, three electrically conductive electrodes (gate, source and drain electrodes), a channel semiconductor layer, and an electrically insulating gate dielectric layer separating the gate electrode from the semiconductor. The channel semiconductor is in turn in contact with the source and drain electrodes. The materials used to make the OTFTs, and the interfacial properties between various layers of semiconductor, dielectric, and electrodes will affect the performance of the OTFTs. Accordingly, a great deal of recent effort has been devoted to improving the TFT device performance through new semiconductor materials design, improvement of semiconductor ordering, and optimization of semiconductor and dielectric interface, etc. However, little attention has been given to the optimization of interfacial properties between the source/drain electrodes and the semiconductor layer, which often give rises to contact resistance. The contact resistance between the semiconductor and the electrodes can dominate the transport properties of the TFT devices. Minimizing the contact resistance can therefore lead to improvement of TFT performance. There is therefore a critical need to develop new methods, addressed by embodiments of the present disclosure, for minimization of the contact resistance between the semiconductor and the electrodes.

BRIEF DESCRIPTION

In embodiments, the present disclosure is directed to the reduction of contact resistance between the electrodes and the semiconductor layer by increasing the conductivity of the semiconductor at the region which is close to the electrode (or "contact region"). This can be accomplished by doping the contact regions with appropriate dopants or dopant precursors ad discussed in more detail below.

The present disclosure also provides new methods for doping the contact region of an OTFT to increase its conductivity. In one such embodiment, at least one metal electrode is deposited. A dopant such as an acid is deposited on the metal contact. The semiconductor is then deposited and the dopant dopes the contact region.

In another embodiment, a substrate is provided. Dopant or dopant precursor-stabilized metal nanoparticles such as acid-stabilized metal nanoparticles are used to deliver a dopant or chemically reacted dopant (which is a product of the dopant precursor after reaction or decomposition) to a contact region of the semiconductor layer. Upon annealing, the metal nanoparticles coalesce and form an electrically conductive electrode and the dopant or chemically reacted dopant is released. Upon deposition of a semiconductor layer, the dopant or chemically reacted dopant diffuses into the semiconductor layer and forms a contact region. This method delivers dopant or chemically reacted dopant to the region where it has its greatest efficacy and deposits the electrode and the dopant in one single step, whereas in conventional processes the electrode and dopant were separately deposited. This embodiment therefore simplifies the manufacture of an OTFT and reduces costs.

In a further embodiment, the oleic acid-stabilized silver nanoparticles are used to form at least one electrode and dope a contact region of the semiconductor layer.

In an additional embodiment, the semiconductor layer is deposited before the nanoparticles are deposited. Upon annealing, the electrode is formed, dopant or chemically reacted dopant is released, and a contact region is formed in the semiconductor layer.

In another method, a multiple-layer electrode can be formed by depositing acid-stabilized metal nanoparticles, annealing, then depositing different acid-stabilized metal nanoparticles and annealing again.

These and other non-limiting characteristics of the present disclosure are more particularly described below.

BRIEF DESCRIPTION OF THE DRAWINGS

The following is a brief description of the drawings, which are presented for the purpose of illustrating the exemplary embodiments disclosed herein and not for the purpose of limiting the same.

DETAILED DESCRIPTION

Figure 1A:
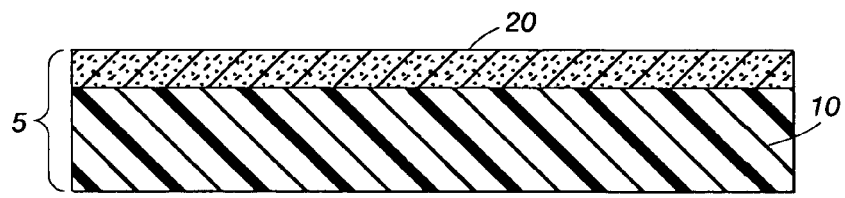
FIGS. 1A to 1D are cross-sectional views of one embodiment described in the present disclosure.

The present disclosure describes methods of producing one or more electrodes with no or minimum contact resistance with a semiconductor component in an electronic device. Also included is the at least one electrode of an electronic device produced by these methods.

A more complete understanding of the components, processes, and apparatuses disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

FIGS. 1A to 1D illustrate the method of one embodiment according to the present disclosure which can be used to make an electrode for use in an OTFT. In FIG. 1A, a substrate 5 is provided. In this example, the substrate 5 is composed of the gate electrode 10 and a dielectric layer 20.

Figure 1B:
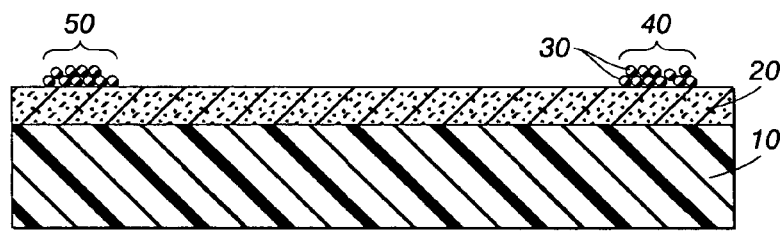

In FIG. 1B, the dopant or dopant precursor-stabilized metal nanoparticles 30 are deposited on the dielectric layer 20 in two locations which correspond to the desired locations for the source electrode 40 and the drain electrode 50. While in this example, two electrodes are formed, the disclosure encompasses the manufacture of one or more electrodes.

Figure 1C:
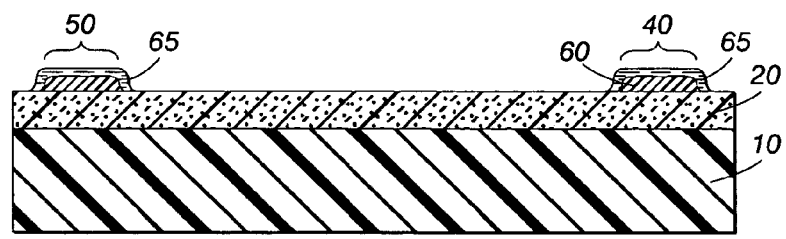

In FIG. 1C, the nanoparticles have been annealed. This annealing is performed at a temperature of from about 50° C. to about 250° C. for a period of from about 1 minute to about 120 minutes. As a result, the nanoparticles coalesce into a thin film state; this change is shown as reference numeral 60. With this change, the source electrode 40 and the drain electrode 50 are considered formed. The annealing also results in the release and/or evaporation of the dopant or chemically reacted dopant (which is a product of the dopant precursor after reaction or decomposition) stabilizer; the residual dopant or chemically reacted dopant may remain on the electrode surface as layer 65.

Figure 1D:
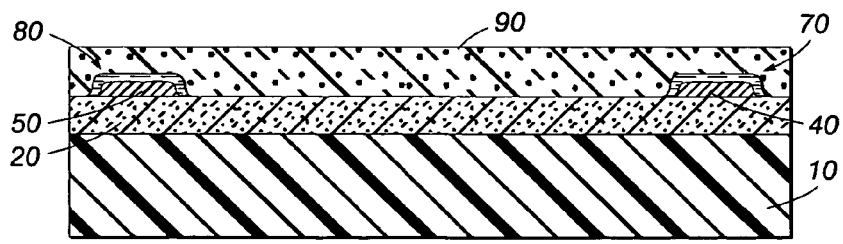

In FIG. 1D, the semiconductor layer 90 has been deposited. The dopant or chemically reacted dopant on the source and drain electrodes diffuses into the semiconductor layer in the regions adjacent to the electrodes, resulting in the doping of the first contact region 70 and second contact region 80. The diffusion could be assisted with a further annealing of the source/drain electrodes and the semiconductor layer. This annealing is performed at a temperature of from about 50° C. to about 250° C. for a period of from about 5 minutes to about 2 hours.

Figure 2A:
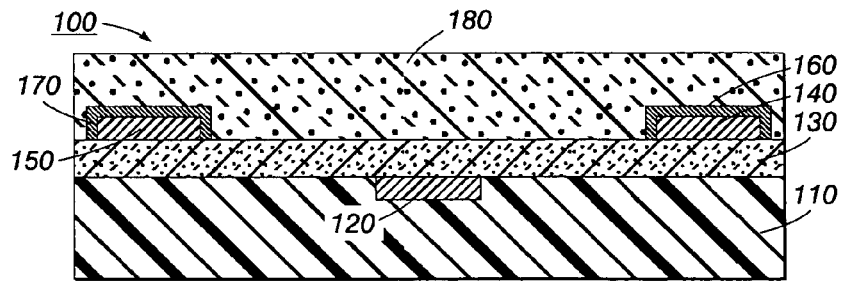
FIGS. 2A to 2D are various possible embodiments for an OTFT made according to the present disclosure.

FIGS. 2A to 2D are representative of possible embodiments of an OTFT made according to the present disclosure. In FIG. 2A, the OTFT 100 comprises a substrate 110 in contact with the gate electrode 120 and the dielectric layer 130. The source electrode 140 contacts the dielectric layer 130 and the semiconductor layer 180. The drain electrode 150 also contacts the dielectric layer 130 and the semiconductor layer 180. The first contact region 160 is the region of the semiconductor layer 180 adjacent to the source electrode 140 into which the dopant or chemically reacted dopant has diffused. The second contact region 170 is the region of the semiconductor layer 180 adjacent to the drain electrode 150 into which the dopant or chemically reacted dopant has diffused.

Figure 2B:
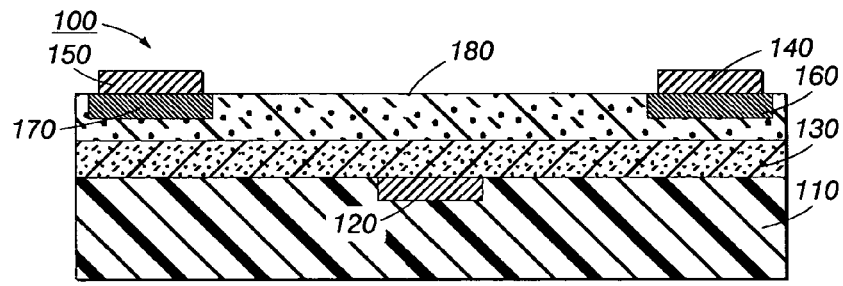

FIG. 2B differs from FIG. 2A in that the semiconductor layer 180 is first deposited on top of the dielectric layer 130 and the source and drain electrodes 140 and 150 are deposited upon the semiconductor layer. To make this embodiment of an OTFT, the steps of the method shown in the embodiments of FIGS. 1A to 1D are modified. First, the semiconductor layer is deposited and annealed. The dopant or dopant precursor-stabilized nanoparticles are then deposited. Finally, the semiconductor layer and the nanoparticles are annealed to release the dopant or chemically reacted dopant from the nanoparticles and form the source/drain electrodes and the contact region 160 and 170. In an alternative method, the semiconductor layer would be deposited without annealing and the nanoparticles would be deposited on the semiconductor layer. Both layers would then be annealed.

Figure 2C:
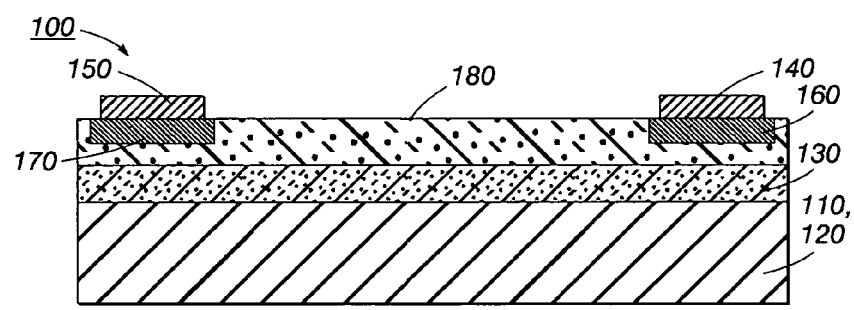

FIG. 2C differs from FIG. 2B in that the substrate 110 also acts as the gate electrode 120. The method of manufacture is identical otherwise.

Figure 2D:
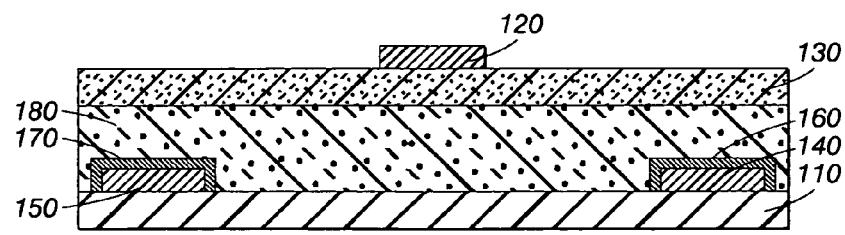

In FIG. 2D, the source and drain electrodes 140 and 150 are deposited on the substrate 110. The semiconductor layer 180 is deposited over and between the source and drain electrodes 140 and 150. The dielectric layer 130 is then deposited over the semiconductor layer 180 and the gate electrode 120 is deposited over the dielectric layer 130. In this embodiment of an OTFT, the steps shown in FIGS. 1A to 1D could be followed.

As FIGS. 2A to 2D make clear, the source and drain electrodes may be formed on any layer of the OTFT. The methods of the present disclosure contemplate depositing the nanoparticles over any layer of the OTFT which has an exposed surface and annealing the nanoparticles and the layer as required to form the electrodes. In some methods, only one annealing step is required; in others, two annealing step may be needed.

The substrate may be composed of materials including but not limited to silicon, glass plate, plastic film or sheet. For structurally flexible devices, plastic substrate, such as for example polyester, polycarbonate, polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon.

The gate electrode is composed of an electrically conductive material. It can be a thin metal film, a conducting polymer film, a conducting film made from conducting ink or paste or the substrate itself, for example heavily doped silicon. Examples of gate electrode materials include but are not restricted to aluminum, gold, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges from about 10 to about 500 nanometers for metal films and from about 0.5 to about 10 micrometers for conductive polymers.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm). The dielectric layer is formed using conventional processes known in the art, including those processes described in forming the gate electrode.

The semiconductor layer generally is an organic semiconducting material. Examples of organic semiconductors include but are not limited to acenes, such as anthracene, tetracene, pentacene, and their substituted derivatives, perylenes, fullerenes, oligothiophenes, polythiophenes and their substituted derivatives, polypyrrole, poly-p-phenylenes, poly-p-phenylvinylidenes, naphthalenedicarboxylic dianhydrides, naphthalene-bisimides, polynaphthalenes, phthalocyanines such as copper phthalocyanines or zinc phthalocyanines and their substituted derivatives. In one exemplary embodiment, the semiconductor used is a p-type semiconductor. The semiconductor layer is from about 5 nm to about 1000 nm thick. In certain configurations, the semiconductor layer completely covers the source and drain electrodes. In other configurations, the semiconductor layer only covers partial source and drain electrodes. The semiconductor layer can be formed by molecular beam deposition, vacuum evaporation, sublimation, spin-on coating, dip coating and other conventional processes known in the art, including those processes described in forming the gate electrode.

In embodiments, the source/drain electrodes are made of dopant or dopant precursor-stabilized metal nanoparticles. The metal of the metal nanoparticles could be for example, gold, silver, platinum, copper, cobalt, indium, nickel, and their alloys. In exemplary embodiments, the metal nanoparticles are silver nanoparticles. In the methods of the present disclosure, nanoparticles are understood to be particles having a size of from 0.1 nanometers to 999 nanometers. The dopant and dopant precursor of the stabilized metal nanoparticles can be an organic acid containing for example 2 to about 30 carbon atoms. In embodiments, the dopant is for example oleic acid. The dopant precursor could react or decompose to form a dopant which is referred as chemically reacted dopant. In embodiments, the acid stabilized metal nanoparticles are used. These acid-stabilized nanoparticles can be made by any suitable approaches. For example, oleic acid-stabilized silver nanoparticles can be synthesized by heating CF3COOAg in isoamylether in the presence of oleic acid (Lin, X. Z, et al., *Langmuir*, 2003, 19, 10081.)

The source/drain electrodes can be from about 10 nanometers to 1000 nanometers thick, including from about 50 to about 500 nanometers thick.

The methods of the present disclosure also contemplate using a mixture of various acid-stabilized metal nanoparticles to form an electrode having a single layer or multiple layers. For example, oleic acid-stabilized silver nanoparticles and oleic acid-stabilized gold nanoparticles may be simultaneously deposited. Upon annealing, a single-layer electrode homogeneously consisting of gold and silver would be formed. In another example, oleic acid-stabilized silver nanoparticles are deposited and annealed, then oleic acid-stabilized gold nanoparticles are deposited and annealed. This would result in a two-layer electrode. Alternatively, various acids could also be used to dope the contact regions. For example, oleic acid-stabilized silver nanoparticles and propanoic acid-stabilized silver nanoparticles may be simultaneously deposited. Upon annealing, a single-layer silver electrode would be formed and both oleic acid and propanoic acid or their chemically reacted species would be available for doping the contact region.

The nanoparticles are deposited by any methods known in the art. These methods include printing, spraying, spinning-on, stamping, dipping, and the like. The nanoparticles may also be dissolved in a solvent having appropriate properties such as cyclohexane, water, toluene, xylene, mesitylene, chlorobenzene, chloroform, tetrahydrofuran, isopar, methoxyethanol, and the like. The methods of the present disclosure contemplate depositing the nanoparticles in solution and then drying the solution to remove the solvent.

The various components of the OTFT may be deposited upon the substrate in any order. Generally, however, the gate electrode and the semiconductor layer should both be in contact with the dielectric layer. In addition, the source and drain electrodes should both be in contact with the semiconductor layer.

The following examples illustrate an OTFT made according to the methods of the present disclosure. The examples are merely illustrative and are not intended to limit the present disclosure with regard to the materials, conditions, or process parameters set forth therein. All parts are percentages by volume unless otherwise indicated.

EXAMPLES

Example 1

An n-doped silicon wafer with a 100-nm silicon oxide layer was used as substrate. The doped wafer functioned as the gate electrode and the silicon oxide layer functioned as the gate dielectric which had a capacitance of about 30 nanofarads per square centimeter ($nF/cm^2$) as measured with a capacitor meter. The silicon oxide surface was first cleaned with argon plasma and then immersed in a 0.1 M solution of octyltrichlorosilane (OTS-8) in toluene at 60° C. for 20 minutes to form a self-assembly monolayer. A solution of oleic acid-stabilized silver nanoparticles (prepared according to Lin, X. Z, et al., *Langmuir*, 2003, 19, 10081.) in cyclohexane (5-wt %) was spin-coated on the OTS-8-modified silicon wafer. After annealing at 200° C. for 45 min, a highly conductive thin film was formed. The conductivity of the thin film was measured to be $2 \times 10^4$ S/cm. The conductive thin film was mechanically patterned into electrodes with channel length of 19 μm and channel width of 1600 μm. The following polythiophene was used as the semiconductor:

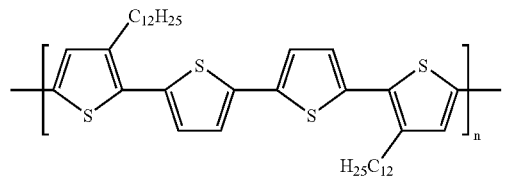

Figure 3:
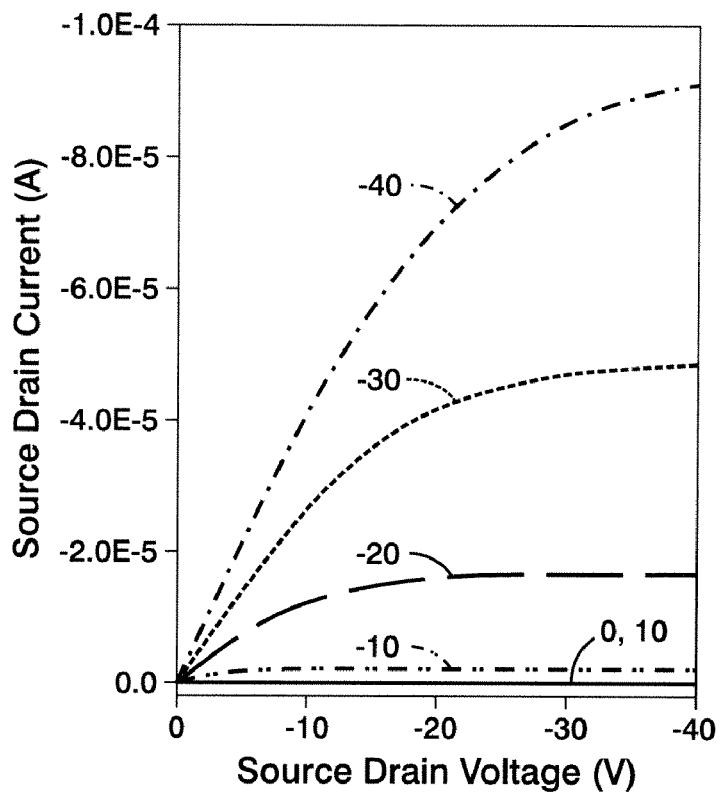
FIG. 3 is a graph showing the output curve of an OTFT made according to the present disclosure.

PQT-12 where n is a number of from about 5 to about 5,000. In this example, the polymer possessed an $M_w$ of 22,900 and $M_n$ of 17,300 relative to polystyrene standards. This polythiophene and its preparation are described in U.S. Patent Application Publication No. 2003/0160230, the disclosure of which is totally incorporated herein by reference. A 30-nm thin film of semiconductor layer was deposited by spin coating a 0.3 wt % solution of PQT-12 in dichlorobenzene solution at a speed of 1,000 rpm for about 100 to about 120 seconds. The TFT device was subsequently annealed at 140° C. for about 30 min to induce molecular ordering in the semiconductor layer. FIG. 3 shows the output curves of the device. As can be noted, the linear current-voltage behavior of each curve as the source drain voltage approached zero showed an ideal ohmic contact (i.e., no contact resistance). The carrier charge mobility was calculated to be 0.12 $cm^2 N.s$.

Comparative Example 1

Figure 4:
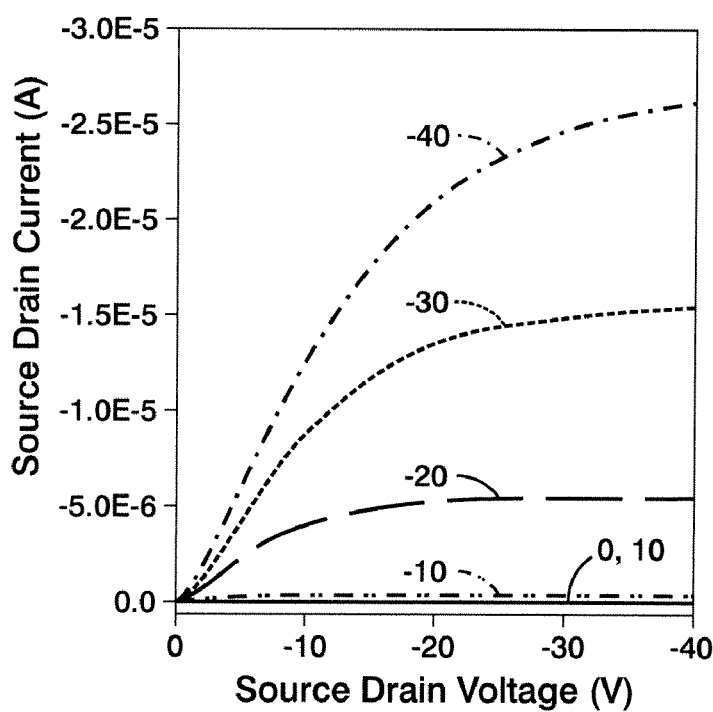
FIG. 4 is a graph showing the output curve of an OTFT not made according to the present disclosure for comparative purposes.

A thin film transistor with channel length of 13 μm and channel width of 1650 μm was fabricated using the same method as described in Example 1 except that vacuum evaporated pure silver was used as the electrode material. FIG. 4 shows the output curves for the comparative device. An "S-type" curve at the linear regime indicates obvious contact resistance. The mobility was calculated to be 0.049 $cm^2/V.s$, which is 2.5 times lower than that of Example 1.

Comparative Example 2

Figure 5:
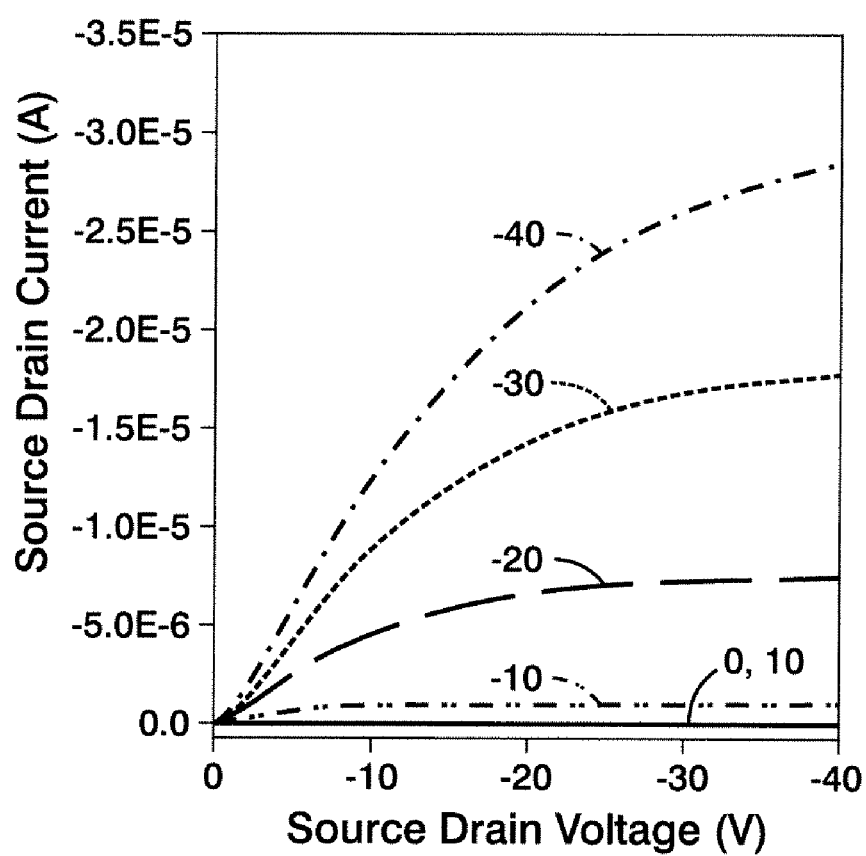
FIG. 5 is a graph showing the output curve of an OTFT not made according to the present disclosure for comparative purposes.

A thin film transistor with channel length of 17 μm and channel width of 1600 μm was fabricated using the same method as described in Example 1 except that oleylamine-stabilized silver nanoparticles were used instead of oleic acid-stabilized silver nanoparticles. The conductivity of the resulting thin film electrodes from oleylamine-stabilized silver nanoparticles was measured to be $2 \times 10^4$ S/cm, which is the same as that obtained from oleic acid-stabilized silver nanoparticles. FIG. 5 shows the output curves for the comparative device. An "S-type" curve at the linear regime indicates obvious contact resistance. The mobility was calculated to be 0.043 $cm^2/V.s$, which is three times lower than that of Example 1 even though the electrode had the same conductivity and the same semiconductor PQT-12 was used. This evidence supports the use of acid or its chemically reacted species for in-situ doping of the contact regions of the semiconductor layer.

Silver has a work function (4.3 eV) which is much lower than the Highest Occupied Molecular Orbital level of the semiconductor PQT-12 (~5.05 eV). When silver is used as the electrode material, contact resistance is to be expected due to an energetic mismatch between the silver electrode and the semiconductor. Comparative example 1 clearly shows the existence of a contact resistance. However, no contact resistance was observed for the device with electrodes generated from the oleic acid-stabilized silver nanoparticles. This minimization of elimination of contact resistance can be attributed to the oleic acid or its chemically reacted forms in the electrodes, which doped the contact regions of the semiconductor layer.

To further verify the existence of oleic acid or its chemically reacted forms on the electrodes, the advanced water contact angle of the surface of the conductive thin films generated from the silver nanoparticles was measured. A contact angle as large as 112° was observed for the films generated from both the oleic acid-stabilized and the oleylamine-stabilized nanoparticles, which confirmed the existence of oleic acid or oleylamine layer or their chemically reacted forms on the surface of the respective electrodes. Meanwhile, the existence of oleylamine or its chemically reacted form also excludes the effect of a long alkyl chain on contact resistance.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A method for making an electronic device comprising:
   providing acid-stabilized metal nanoparticles and a substrate which may optionally include a gate electrode and/or a dielectric layer;
   depositing the acid-stabilized metal nanoparticles, followed by annealing to form one or more metal electrodes;
   depositing a semiconductor layer with an optional annealing, wherein no or minimum contact resistance exist between the metal electrodes and the semiconductor layer.

2. The method of claim 1, wherein the acid-stabilized metal nanoparticles are acid-stabilized silver nanoparticles.

3. The method of claim 1, wherein the acid-stabilized metal nanoparticles are oleic acid-stabilized metal nanoparticles.

4. The method of claim 1, wherein acid-stabilized metal nanoparticles are oleic acid-stabilized silver nanoparticles.

5. The method of claim 1, wherein the step of providing acid-stabilized metal nanoparticles is performed by providing a mixture of acid-stabilized metal nanoparticles comprising different metals and/or different acids.

6. The method of claim 1, wherein the acid of the acid-stabilized metal nanoparticles is selected from the group of organic acids containing from about 2 to about 30 carbon atoms.

7. The method of claim 1, wherein the metal of the acid-stabilized metal nanoparticles is selected from the group consisting of silver, gold, platinum, copper, cobalt, indium, and nickel.

8. The method of claim 1, wherein the step of depositing acid-stabilized metal nanoparticles is performed by a deposition method selected from the group consisting of printing, spraying, stamping, spinning-on, and dipping.

9. The method of claim 1, wherein the step of depositing acid-stabilized metal nanoparticles is performed by:
   depositing a dispersion comprising of acid-stabilized metal nanoparticles and a liquid; and
   drying the deposited acid-stabilized metal nanoparticle features to remove the liquid and leave the acid-stabilized metal nanoparticles in the features.

10. The method of claim 1, wherein the step of forming at least one metal electrode and releasing acid or chemically reacted acid is performed by annealing the acid-stabilized metal nanoparticle features to form at least one electrically conductive metal electrode and release acid or chemically reacted acid.

11. The method of claim 10, wherein the annealing is performed at a temperature of from about 50° C. to about 250° C. for a period of from about 1 minute to about 120 minutes.

12. The method of claim 1, wherein the step of depositing the semiconductor layer is prior to the step of depositing of the acid-stabilized metal nanoparticles.

13. The method of claim 1, wherein the step of optional annealing the deposited acid-stabilized nanoparticles and the semiconductor layer is performed by annealing at a temperature of from about 50° C. to about 250° C. for a period of from about 5 minutes to about 120 minutes.

14. The method of claim 1, wherein the acid or chemically reacted acid from the acid-stabilized metal nanoparticles diffuses into the semiconductor layer and forms a contact region, which eliminates or minimizes the contact resistance.

15. The electronic device produced by the method of claim 1.

* * * * *

UNITED STATES PATENT AND TRADEMARK OFFICE
CERTIFICATE OF CORRECTION

| | | |
|---|---|---|
| PATENT NO. | : 7,306,969 B2 | Page 1 of 1 |
| APPLICATION NO. | : 11/187552 | |
| DATED | : December 11, 2007 | |
| INVENTOR(S) | : Yiliang Wu et al. | |

It is certified that error appears in the above-identified patent and that said Letters Patent is hereby corrected as shown below:

In the Specification

Column 1, lines 7 and 8, after "NIST Contract No.", please delete "70NAN-BOH3033" and insert --70NANB0H3033--.

Signed and Sealed this
Seventeenth Day of September, 2013

Teresa Stanek Rea
*Deputy Director of theUnited States Patent and Trademark Office*